United States Patent [19]

Inoue et al.

[11] Patent Number: 5,233,216

[45] Date of Patent: Aug. 3, 1993

[54] DIELECTRIC ISOLATED SUBSTRATE AND PROCESS FOR PRODUCING THE SAME

[75] Inventors: Yohsuke Inoue, Ibaraki; Michio Ohue, Hitachi; Saburoo Ogawa, Katsuta; Kiyoshi Thukuda; Takeshi Tanaka, both of Hitachi; Yasuhiro Mochizuki, Katsuta, all of Japan

[73] Assignee: Hitachi, Ltd., Tokyo, Japan

[21] Appl. No.: 963,258

[22] Filed: Oct. 19, 1992

Related U.S. Application Data

[63] Continuation of Ser. No. 657,067, Feb. 12, 1991, abandoned.

[30] Foreign Application Priority Data

Feb. 28, 1990 [JP] Japan ................................. 2-48875
Mar. 14, 1990 [JP] Japan ................................. 2-63845

[51] Int. Cl.$^5$ ............................................. H01L 27/12
[52] U.S. Cl. ................................. 257/505; 257/507; 257/520; 257/524; 257/499
[58] Field of Search ............................ 357/49, 50, 59; 257/499, 505, 507, 520, 524

[56] References Cited

U.S. PATENT DOCUMENTS 4,984,052  1/1991  Koshino et al. .................. 357/49

OTHER PUBLICATIONS

Suzuki et al.-vol. 124-No. 11, pp. 1776-1780, 1977 Journal of Electrochemical Society.

Primary Examiner—Edward Wojciechowicz
Attorney, Agent, or Firm—Antonelli, Terry, Stout & Kraus

[57] ABSTRACT

A dielectric isolated substrate wherein a connecting polycrystalline silicon layer has smooth and flat surface on which a single crystal support is bonded and has a densified crystal structure, or is obtained by further heat treatment at 800° C. or higher after deposition, or has no orientation as to growth direction of polycrystalline silicon, or a buffering layer is formed between a polycrystalline silicon layer and a single crystal support, is excellent in bonding between the single crystal support and the polycrystalline silicon layer by preventing voids at the bonded surface, while enhancing reliability.

26 Claims, 13 Drawing Sheets

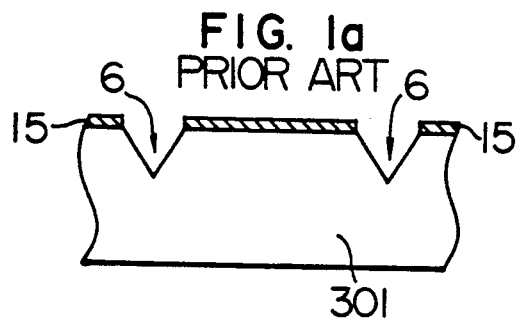
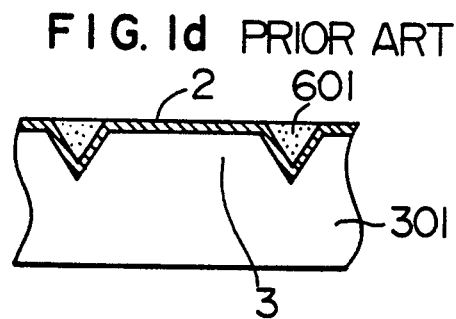
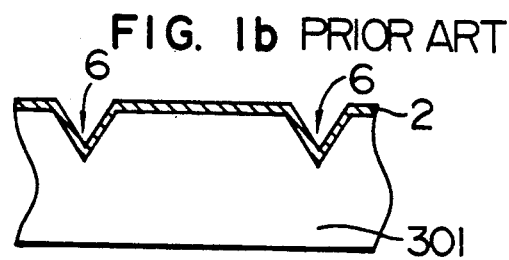
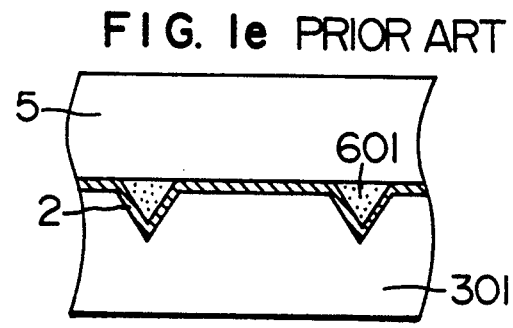
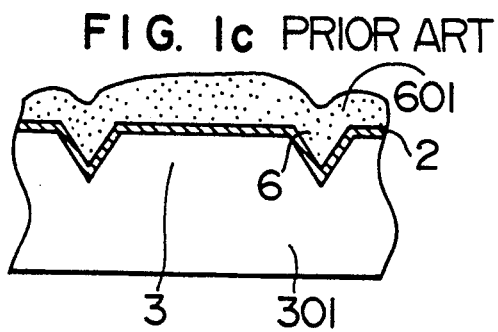
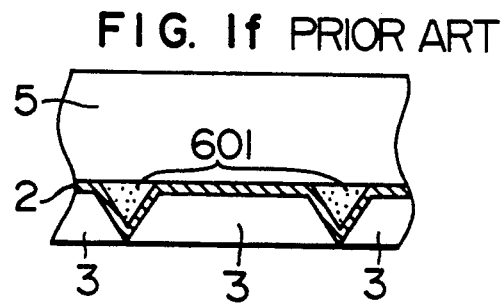
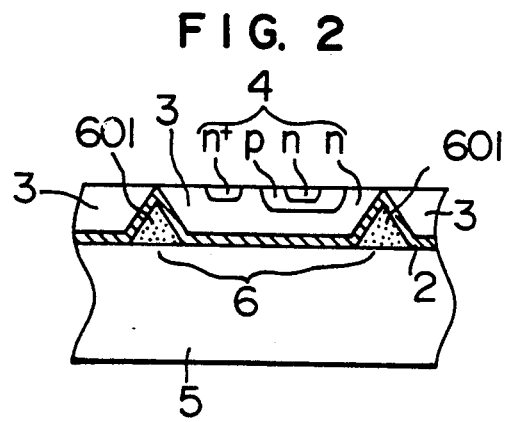

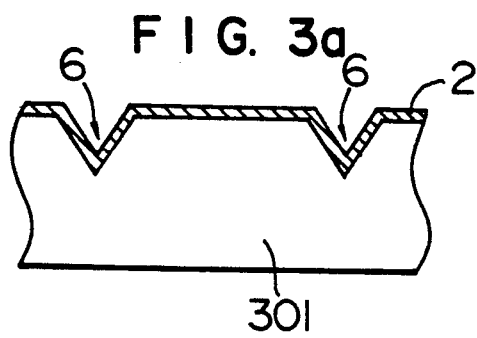
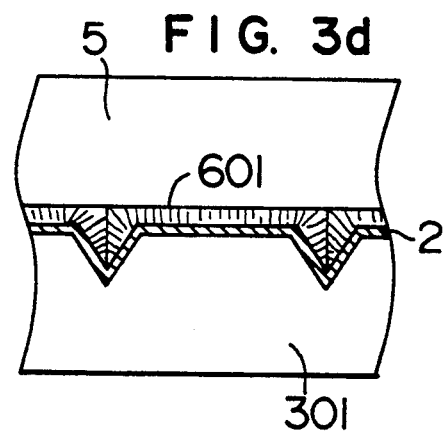
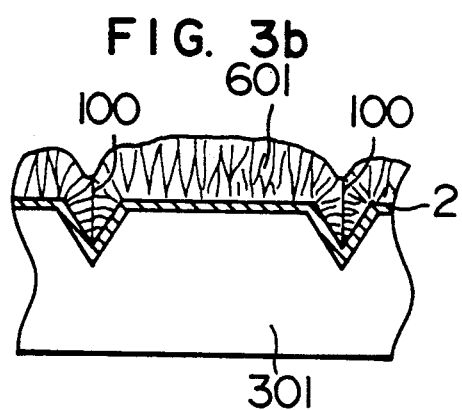
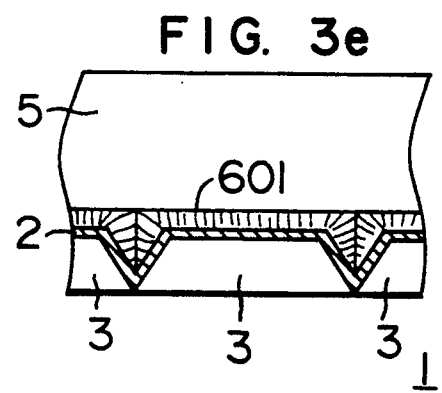
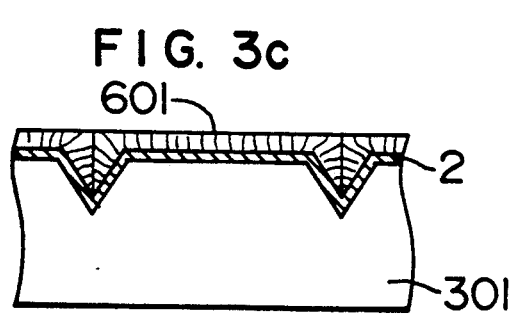

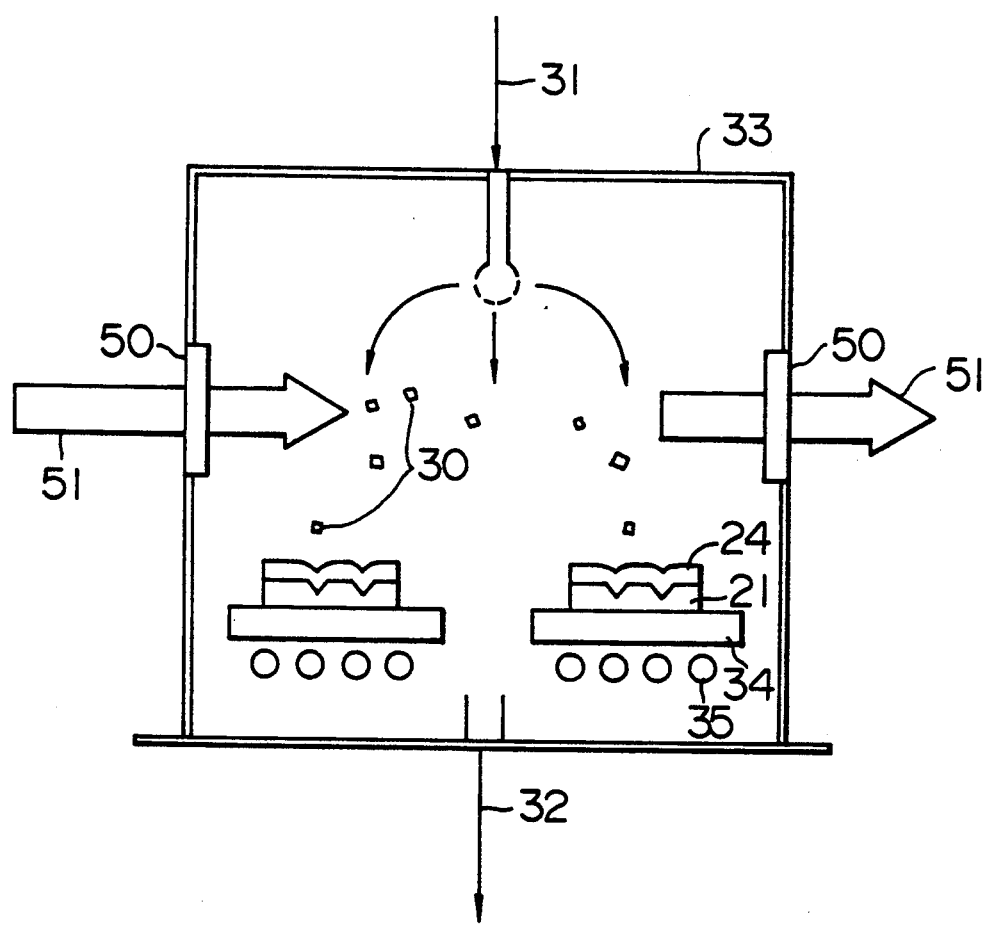
F I G. 13

DIELECTRIC ISOLATED SUBSTRATE AND PROCESS FOR PRODUCING THE SAME

This application is a continuation of application Ser. No. 07/657,067, filed on Feb. 12, 1991, now abandoned.

BACKGROUND OF THE INVENTION

The present invention relates to a dielectric isolated substrate. More particularly, the present invention relates to a dielectric isolated substrate comprising a single crystal silicon support and a process for producing said substrate, as well as to a semiconductor integrated circuit device using said substrate.

In LSI's of high dielectric strength wherein the dielectric strength between elements is as high as several tens of voltages to several hundreds of voltages, it is necessary to perfectly isolate the elements from each other by a dielectric film such as oxide film ($SiO_2$) or the like. In such a technological field, a so-called dielectric isolated substrate is in wide use.

As well known, many of conventional dielectric isolated substrates employ a composite structure wherein a plurality of single crystal silicon islands are formed on the surface of a polycrystalline silicon support via a dielectric film. In these dielectric isolated substrates of composite structure, however, warpage and strain appear in the substrate owing to, for example, the difference in thermal expansion coefficient between the single crystal silicon and the polycrystalline silicon.

In order to solve the above problem, there have come to be used in recent years dielectric isolated substrates of bonded structure which are described in, for example, Japanese Patent Unexamined Publication Nos. 61-292934, 63-14449 and 63-205926 and whose basic structure is shown in FIG. 2. In FIG. 2, a single crystal silicon support 5 and a single crystal wafer (which later becomes single crystal islands 3) are bonded via a dielectric film 2 to form a bonded structure.

In FIG. 2, semiconductor elements 4 are formed in island-shaped single crystal silicon regions 3, and the single crystal islands 3 are formed on a single crystal silicon support 5 via a dielectric film in such a state that the islands 3 are isolated from each other by the dielectric film 2. The isolation grooves 6 existing between and adjacent to the single crystal islands 3 isolated from each other by the dielectric film 2, are filled with polycrystalline silicon 601 formed for connecting the support 5 and the islands 3.

The process for producing such a dielectric isolated substrate of joint structure is described hereinafter, referring to FIG. 1.

Firstly, one principal surface of single crystal silicon wafer 301 is oxidized to form $SiO_2$ 15 on the entire part of the surface; openings are made at desired places of the $SiO_2$ 15; isolation grooves 6 of about 60 μm in depth are formed at these places by anisotropic etching using, for example, a mixed solution of potassium hydroxide and isopropyl alcohol with the $SiO_2$ 15 used as a mask [see FIG. 1(a)].

Next, the $SiO_2$ 15 used as a mask is removed; the same principal surface of the wafer 301 is oxidized again to form an insulating $SiO_2$ film 2 on the entire part of the surface [see FIG. 1(b)]; on the surface of the $SiO_2$ film 2 is accumulated, by chemical vapor deposition, polycrystalline silicon 601 until the isolation grooves 6 are filled completely [see FIG. 1(c)].

Then, the unnecessary portion of the polycrystalline silicon 601 is removed by mechanical cutting and mechanochemical polishing to make the height of the polycrystalline silicon 601 accumulated in the isolation grooves, substantially the same as the surface of the $SiO_2$ film 2 [see FIG. 1(d)].

Thereafter, the polished surface of the polycrystalline silicon 601 is contacted, by an appropriate means, with one side of a single crystal silicon wafer 5 which later becomes a support; the resulting system is subjected to a heat treatment of higher temperature to bond the two wafers completely [see FIG. 1(e)].

Incidentally, the method for bonding the above two semiconductor wafers to produce a dielectric isolated substrate is described in, for example, Japanese Patent Application No. 62-27040.

Lastly, the unnecessary portion of the single crystal wafer 301 is removed by polishing to form single crystal silicon islands to complete a dielectric isolated substrate 1 [see FIG. 1(f)]; then, desired semiconductor elements are formed on the surfaces of the islands 3; the elements are connected by wiring to complete an integrated circuit device (not shown).

In the above prior art, no sufficient consideration was made for the technique for removing the unnecessary portion of the polycrystalline silicon 601 by polishing to allow the polycrystalline silicon 601 to have a smooth flat surface; therefore, it is difficult to obtain a polished surface having a smoothness degree of about 100 Å or less required in the bonding of wafer thereto, and poor bonding is caused easily.

Moreover, when no complete wafer bonding is achieved owing to the poor bonding, the bonding strength is low; as a result, when semiconductor elements are formed in the islands 3 to produce a semiconductor integrated circuit device, the islands are peeled off from the support 5 or shifted owing to the heat treatment applied for formation of semiconductor elements or owing to the strain caused by the heat generated during the operation of the semiconductor elements. Thereby, the wires connecting the elements are broken and the semiconductor integrated circuit device has reduced reliability.

SUMMARY OF THE INVENTION

The objects of the present invention are to solve the above-mentioned problems and provide (a) a dielectric isolated substrate which has no void at the bonded surface, gives substantially no thermal shrinkage and has complete wafer bonding, (b) a process for producing said substrate and (c) a semiconductor integrated circuit device using said substrate.

The present invention provides a dielectric isolated substrate comprising a connecting polycrystalline silicon layer, a plurality of semiconductor single crystal islands insulated from each other and also from said polycrystalline silicon layer by a dielectric film, and a single crystal support bonded to said polycrystalline silicon layer, said connecting polycrystalline silicon layer having a smooth and flat surface to which said single crystal support is bonded and moreover having a densified crystal structure so as to make thermal shrinkage small.

The present invention further provides a dielectric isolated substrate comprising a connecting polycrystalline silicon layer, a plurality of semiconductor single crystal islands insulated from each other and also from said polycrystalline silicon layer by a dielectric film, and a single crystal support bonded to said polycrystalline silicon layer, said polycrystalline silicon layer having a smooth and flat surface to which said single crystal support is bonded and having no orientation as to growth direction of polycrystalline silicon.

The present invention also provides a dielectric isolated substrate comprising a polycrystalline silicon layer, a plurality of semiconductor single crystal islands insulated from each other and also from said polycrystalline silicon layer by a dielectric film, a buffering layer provided in contact with the polycrystalline silicon layer, and a single crystal support bonded to said buffering layer, said buffering layer having a smooth and flat surface to which said single crystal support is bonded.

The present invention moreover provides processes for producing each of the above dielectric isolated substrates and semiconductor integrated circuit devices using each of these substrates.

BRIEF DESCRIPTION OF THE DRAWINGS

FIGS. 1(a) to 1(f) are sectional views for explaining a process for producing a prior art dielectric isolated substrate of bonded structure.

FIG. 2 is a sectional view of a conventional dielectric isolated substrate of bonded structure.

FIGS. 3(a) to 3(e) are sectional views for explaining a process for producing a dielectric isolated substrate according to the method (1) of the present invention.

FIG. 13 is a schematic sectional view of an apparatus for accumulating polycrystalline silicon by photoexcitation deposition, used in other embodiment of the present invention.

DESCRIPTION OF THE PREFERRED EMBODIMENTS

Figure 4:
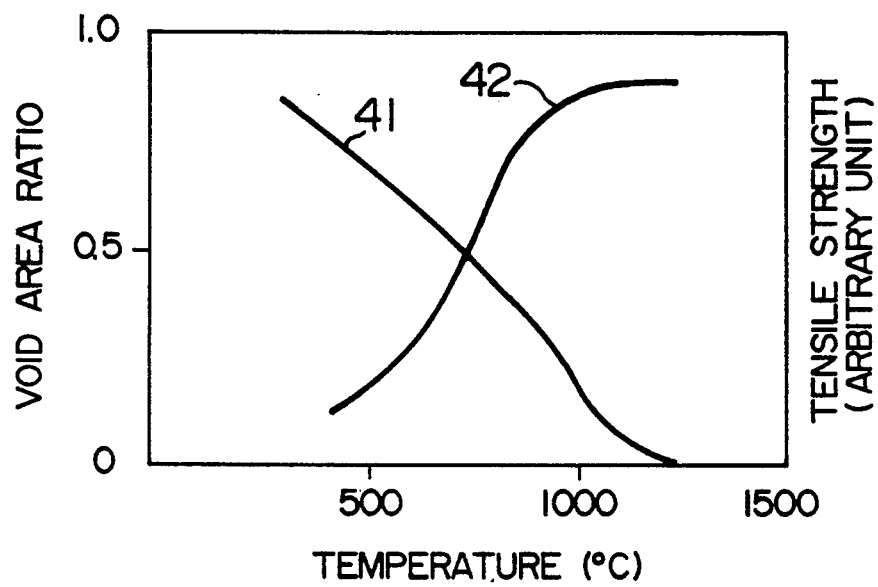
FIG. 4 is a graph showing the relation between temperature of polycrystalline silicon accumulation (deposition) and void area ratio and also showing the relationship between temperature of polycrystalline silicon deposition and tensile strength at bonded surface.

The present inventors investigated reasons for the poor bonding between single crystal support and polycrystalline silicon layer in the dielectric isolated substrate of the prior art and found that main reasons for said poor bonding are as follows.

As described in J. of Electrochem. Soc., Vol. 124, No. 11, p. 1776, 1977, it is known that polycrystalline silicon causes shrinkage when subjected to a heat treatment (e.g. heat treatment for bonding).

Such thermal shrinkage of polycrystalline silicon is believed to appear because the heat energy given by heat treatment allows the polycrystalline silicon atoms to move and this movement reduces the defects of polycrystalline silicon (e.g. voids inside the crystals, rearrangement), or removes the boundaries between crystal grains of similar crystal face orientation to fuse the grains into larger crystal grains, whereby the silicon crystals become more dense and more complete crystals.

Accordingly, the degree of thermal shrinkage of polycrystalline silicon is larger as the polycrystalline silicon has been formed by deposition of lower temperature (such a polycrystalline silicon has more defects of voids, rearrangement and the like and smaller crystal grains) and as the accumulation amount of polycrystalline silicon is larger.

The heating conditions after deposition also affect the degree of thermal shrinkage. That is, the degree of thermal shrinkage is larger as the heating temperature is higher and as the heating time is longer.

Thus, in the prior art, even if the surface of polycrystalline silicon 601 is polished to a mirror surface having an evenness of 100 Å or less required for complete bonding, the incomplete crystal state of polycrystalline silicon 601 gives rise to shrinkage of polycrystalline silicon particularly at the isolation groove portions when subjected to a heat treatment after bonded to a single crystal support, whereby dents having a depth of several hundreds of angstroms are generated at the bonded surface. This presumably gives no complete wafer bonding.

In the dielectric isolated substrate of bonded structure according to the present invention, the degree of thermal shrinkage of polycrystalline silicon is made small by densifying the crystal structure of the polycrystalline silicon connecting to a plurality of semiconductor single crystal islands, by employing one of the following methods (1) to (3).

(1) Polycrystalline silicon is formed by deposition at a temperature of 1,000° C. or more, whereby the crystal growth direction of polycrystalline silicon between semiconductor single crystal islands is made substantially perpendicular to the sides of nearby semiconductor single crystal islands and the crystal structure of the formed polycrystalline silicon is densified.

(2) The semiconductor single crystal wafer having thereon polycrystalline silicon formed by deposition is subjected to a heat treatment at a temperature of about 800° C. or more to density the crystal structure of the polycrystalline silicon so that the average grain diameter of the polycrystalline silicon is at least 6 μm between the semiconductor single crystal islands.

(3) Polycrystalline silicon is formed by deposition in an impurity gas to allow the resulting polycrystalline silicon layer to contain an impurity in an amount of 20-200 ppm.

The thus obtained polycrystalline silicon has a sufficiently dense crystal structure as a result of the treatment by one of the methods (1) to (3), and it is hardly made more dense in the later heat treatment. Consequently, the polycrystalline silicon gives small thermal shrinkage and causes no void at the interface of a single crystal support.

The present invention is hereinafter described in detail with reference to the accompanying drawings.

FIGS. 3(a) to 3(e) are sectional views for explaining a process for producing a dielectric isolated substrate according to the above method (1). In this method (1), silicon is used as a material for substrate.

In FIG. 3, firstly, isolation grooves 6 of about 50 μm in depth are formed on one principal surface of a single crystal silicon wafer 301 of 4 in. in diameter and 500 μm in thickness in the same manner as in the prior art; then, on the entire part of the resulting surface is formed a SiO$_2$ film 2 of about 1.5 μm in thickness as a dielectric film [see FIG. 3(a)].

Next, on the SiO$_2$ film 2 is deposited polycrystalline silicon 601 of dense crystal structure for connecting single crystal islands 3 which are formed later, in a thickness of about 80 μm (measured from the bottom of the grooves 6) until at least the grooves 6 are completely filled, according to high temperature chemical vapor deposition at 1,000° C. or more, preferably 1,200° C. or more [see FIG. 3(b)].

In the deposition at such a temperature, the formed crystal grains have relatively large grain diameters. Resultantly, there occurs no fusion of crystal grains and, even when a later heat treatment is effected, thermal shrinkage due to fusion of crystal grains hardly occurs.

Also in the deposition at a high temperature, since there are formed many needle-like crystal grains which grow perpendicularly to the growth surface, the crystal grains of polycrystalline silicon accumulated in the isolation grooves 6 grow substantially perpendicularly to the inner surfaces of the isolation grooves and, as a result, in the center of each isolation groove is formed an interface 100 at which the crystal grains of different growth direction collide with each other.

Thus, when large crystal grains of similar growth direction are formed in a dense state, the probability of formation of defects (e.g. voids, rearrangement) inside crystals is low, and thermal shrinkage due to such defects hardly occurs.

Then, the surface of the polycrystalline silicon 601 is mechanically polished in the same manner as in the prior art to remove surface unevenness of about several tens of micrometers present owing to the isolation grooves 6 and convert to a smooth and flat surface; thereafter, the surface is flattened by mechanochemical polishing to a surface smoothness of 100 Å or less [see FIG. 3(c)].

In this case, it is desirable that the polycrystalline silicon 601 is polished to a level (height) very close (10 μm or less) to the SiO$_2$ film 2 formed at the bottom of the single crystal silicon wafer 301, in order to minimize the deformation of silicon wafer which later appears owing to the difference in thermal expansion coefficients between polycrystalline silicon and single crystal silicon, in the heat treatment applied when semiconductor elements are formed in silicon wafer regions 301.

Thereafter, a single crystal wafer 5 (a support) of 500 μm in thickness is bonded to the surface of the polycrystalline silicon 601 according to the same wafer bonding method as in the prior art [see FIG. 3(d)].

Lastly, the unnecessary portion of the single crystal silicon wafer 301 is removed by polishing to form single crystal islands 3, whereby a dielectric isolated substrate 1 is completed [see FIG. 3(e)].

After that, a semiconductor element is formed in each of the single crystal islands 3 according to an ordinary LSI process, and wiring is conducted between the elements to complete an integrated circuit device.

FIG. 4 is a graph showing the relation (curve 41) between accumulation temperature of polycrystalline silicon 601 and void area ratio (the porportion of area of voids appearing in the bonding portion, to total wafer area) and also the relation (curve 42) between said accumulation temperature and tensile strength at bonded surface.

As is clear from FIG. 4, when the acumulation temperature of polycrystalline silicon 601 is 1,000° C. or more, the void area ratio is small and the tensile strength at the bonded surface is improved.

In the method (1), since the polycrystalline silicon 601 is formed at a high deposition temperature, the polycrystalline silicon 601 grows substantially perpendicularly to the surfaces of the isolation grooves, i.e. the sides of the nearby single crystal islands 3 and in a dense state and forms a crystal structure low in defects; therefore, the resulting polycrystalline silicon 601 gives small shrinkage in the later heat treatment. The above object cannot be attained when polycrystalline silicon crystals are grown by heating but in a non-dense structure.

Thus, in the method (1), the appearance of unevennesses of several hundreds of angstroms at the bonded surface can be avoided by the thermal treatment, whereby the complete bonding of the polycrystalline silicon to the single crystal support 5 is made possible.

FIG. 5(a) to 5(d) are sectional views for explaining a process for producing a dielectric isolated substrate according to the method (2) of the present invention. In FIGS. 5(a) to 5(d), the same numerals have been given to the same or equivalent substrate constituents as in FIG. 3.

Figure 5A:
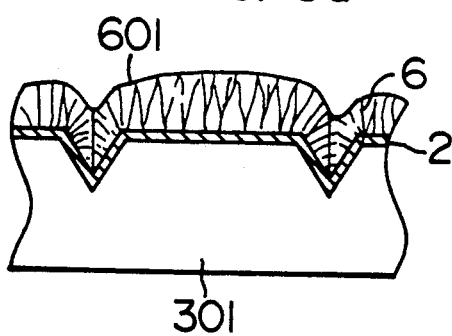
FIGS. 5(a) to 5(d) are sectional views for explaining a process for producing a dielectric isolated substrate according to the method (2) of the present invention.

Firstly, isolation grooves 6 are formed on one principal surface of a single crystal wafer 301 in the same manner as mentioned above; on the entire part of the resulting surface including the inner surface of the isolation grooves 6 is formed a SiO$_2$ film 2 for insulation purpose; on the SiO$_2$ film 2 is deposited polycrystalline silicon 601 or amorphous silicon until the isolation grooves 6 are filled completely [see FIG. 5(a)].

In this case, unlike in the method (1), the temperature for depositing polycrystalline silicon 601 is not particularly restricted. When the polycrystalline silicon 601 is deposited at low temperatures lower than 500° C., it becomes amorphous silicon.

Then, the wafer having thereon amorphous silicon or polycrystalline silicon 601 accumulated is subjected to a heat treatment of 800° C. or more. The heat treatment conditions (temperature and time) are empirically determined so that the polycrystalline silicon 601 gives small shrinkage (smaller than 50 Å) as shown below, in view of the accumulation conditions of polycrystalline silicon 601, the conditions of later bonding, the depth of isolation grooves 6, etc. [see FIG. 5(b)].

Figure 6:
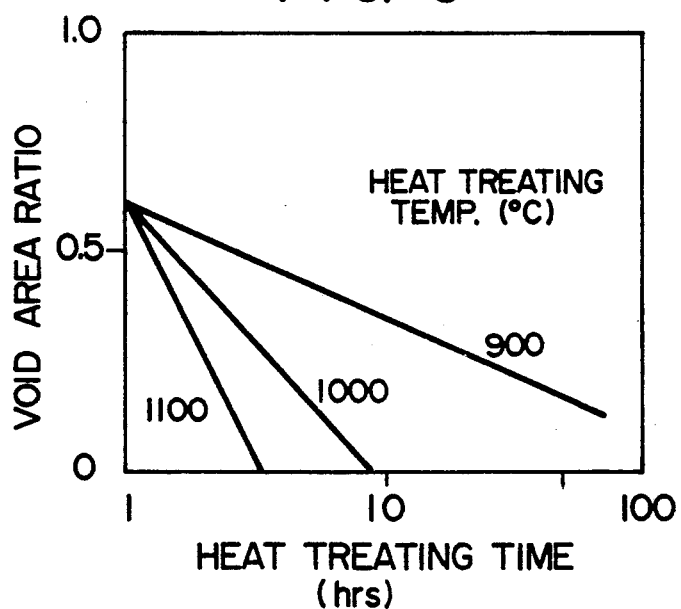
FIG. 6 is a graph showing the relation between void area ratio and heat treatment conditions.

FIG. 6 is a graph showing the relation between void area ratio and heat treatment conditions.

It is clear from FIG. 6 that when the depth of isolation grooves is, for example, 50 μm, a heat treatment at a temperature of 1,000° C. or more is preferable in order to obtain a void area ratio of zero within a practical heat treatment time (up to 10 hours).

Figure 7:
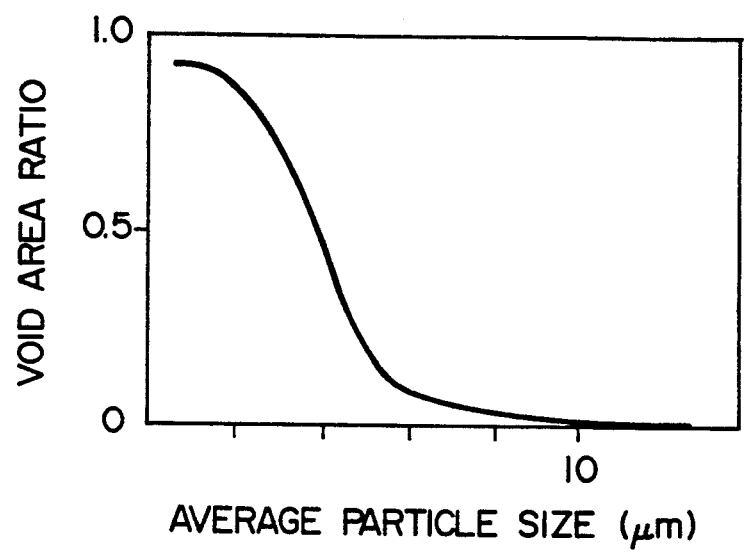
FIG. 7 is a graph showing the relation between void area ratio and average grain diameter of polycrystalline grains.

FIG. 7 is a graph showing the relation between void area ratio and average grain diameter of polycrystalline grains in the vicinity of bonding surface in isolation groove regions.

As is clear from FIG. 7, void area ratio can be made zero by applying such a heat treatment that the average grain diameter becomes 5 μm or more, preferably 6 μm or more. Incidentally, the average grain diameter is defined by L/n wherein L is a length of an arbitrary straight line on the polished surface and n is a number of the grain boundaries which cross the straight line L.

Figure 5C:
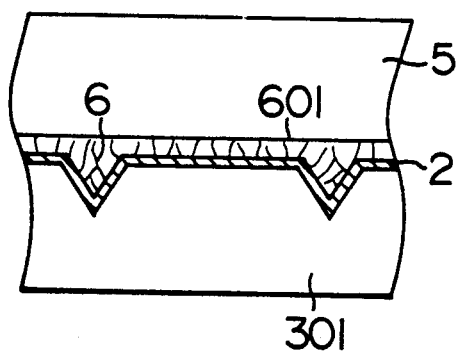

Thereafter, the surface of the polycrystalline silicon 601 is subjected to grinding and mechanochemical polishing in the same manners as in the method (1) to convert it to a flat surface; to the flat surface is bonded a single crystal wafer 5 (a support) [see FIG. 5(c)].

Figure 5D:
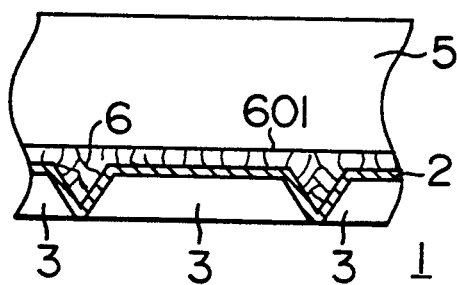

Lastly, the unnecessary portion of the single crystal wafer 301 is removed by polishing to complete a dielectric isolated substrate 1 [see FIG. 5(d)].

In the method (2), the polycrystalline silicon 601 is subjected to a heat treatment to make it sufficiently dense beforehand (that is, to allow the polycrystalline silicon 601 to cause shrinkage beforehand); therefore, its shrinkage in the later heat treatments can be made negligibly small.

Accordingly, the appearance of voids at the bonded surface can be avoided and the complete bonding of the polycrystalline silicon to the support 5 is made possible.

Figure 8A:
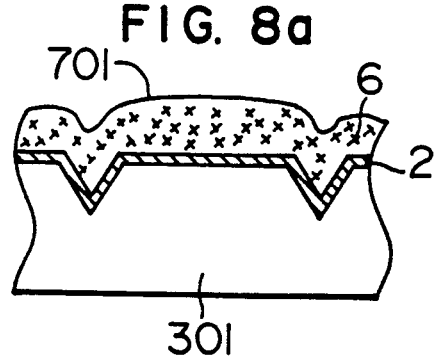
FIGS. 8(a) to 8(b) are sectional view for explainging a process for producing a dielectric isolated substrate according to the method (3) of the present invention.
Figure 5B:
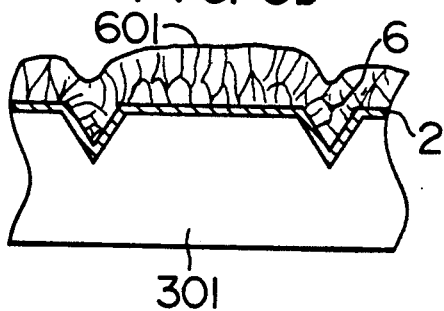
Figure 8B:
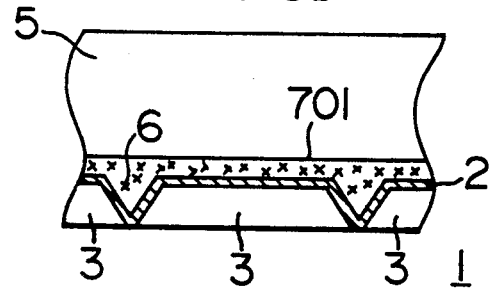

FIGS. 8(a) to 8(b) are sectional views for explaining a process for producing a dielectric isolated substrate according to the method (3) of the present invention. In FIGS. 8(a) and 8(b), the same numerals have been given to the same or equivalent substrate constituents as in FIG. 3.

Firstly, isolation grooves 6 are formed on one principal surface of a single crystal wafer 301 in the same manner as mentioned above, and a $SiO_2$ film 2 is formed on the entire part of the resulting surface including the inner surfaces of the isolation grooves 6.

Then, chemical vapor deposition is effected while adding an impurity gas (e.g. $CO_2$ gas) to a raw material gas for silicon, whereby polycrystalline silicon 701 containing an impurity element such as oxygen or the like is deposited on the $SiO_2$ film 2 until at least the isolation grooves 6 are filled completely [see FIG. 8(a)].

Next, the surface of the polycrystalline silicon 701 is subjected to grinding and mechanochemical polishing in the same manners as in the method (1) to make the surface smooth and flat; a wafer 5 which later becomes a support is bonded to the resulting surface [see FIG. 8(b)].

In this case, no void appears in the polycrystalline silicon 701 in the heat treatment for bonding or other heat treatment because the polycrystalline silicon containing a large amount of the impurity element gives very small shrinkage as described in Japanese Patent Examined Publication No. 45-32731, and complete wafer bonding is obtained.

Figure 9:
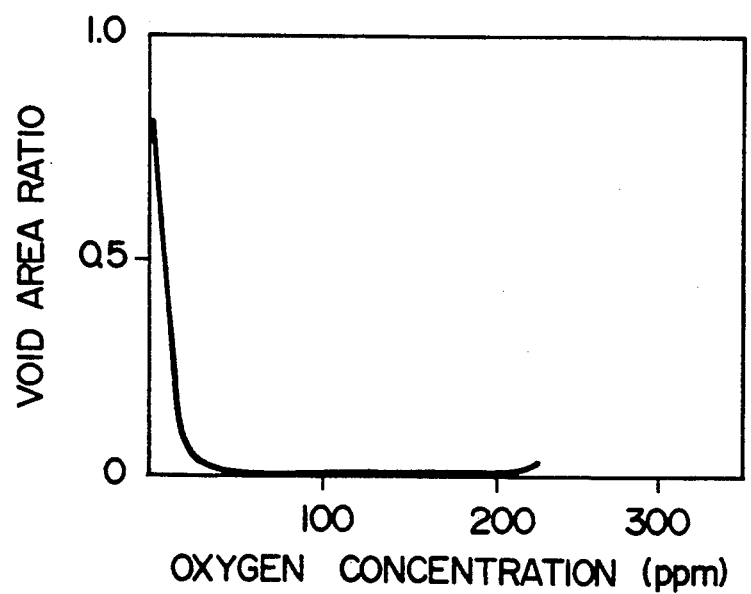
FIG. 9 is a graph showing the relation between void area ratio and oxygen concentration.

FIG. 9 is a graph showing the the relation between void area ratio and oxygen concentration in polycrystalline silicon when the polycrystalline silicon is formed by deposition with $CO_2$ gas being added.

When the oxygen concentration in polycrystalline silicon is more than 200 ppm in terms of oxygen atoms, there is deposited very dense polycrystalline silicon and, presumably owing to its growth stress, the substrate gives large curvature during the deposition of the polycrystalline silicon 701 making the further deposition difficult. However, as is clear from FIG. 9, when the oxygen concentration is 20-200 ppm, no void appears and complete wafer bonding is obtained. Incidentally, the impurity gas may be other than $CO_2$, for example, $N_2O$ or the like.

The above methods (1) to (3) have been described on respective cases using a single crystal wafer as the support. However, the present invention is not restricted to these cases, and the use of a fumed quartz wafer having a smooth flat surface, a densified polycrystalline silicon wafer or a single crystal wafer having an oxide film formed on the surface gives the same effect.

The above methods (1) to (3) have been described on respective cases where polycrystalline silicon 601 exists between the support 5 and the single crystal islands 3. However, the present invention is not restricted to these cases, and it is possible to grind polycrystalline silicon 601 to make its surface smooth and flat to such an extent that the $SiO_2$ film 2 on the bottoms of the single crystal islands 3 and the polycrystalline silicon in the isolation grooves 6 form the same one plane and then to bond a support 5 to the plane.

The formation of polycrystalline silicon can be effected by chemical vapor deposition using, as a raw material gas, a silane type gas such as $SiH_4$, $Si_2H_6$, etc., or a chlorosilane type gas such as $SiH_2Cl_2$, $SiHCl_3$, etc.

It often happens that no smooth flat surface having evenness of 100 Å or less can be obtained by polishing and accordingly bonding with single crystal support becomes poor even when polycrystalline silicon 601 has been formed in isolation grooves 6 by chemical vapor deposition at an elevated temperature so that the crystal growth direction is perpendicular to the sides of nearby semiconductor single crystal islands.

Main reasons for the above (no smooth flat surface can be obtained) are explained below in detail with explaining the method for polishing of polycrystalline silicon 601 according to the prior art.

In polishing of polycrystalline silicon 601, at first the polycrystalline silicon 601 is cut to a distance of about 5 μm from the bottoms of single crystal islands by mechanical polishing (physical polishing) in order to eliminate the unevenness brought about by nonuniform formation of polycrystalline silicon 601 and the unevennesses of about 10 μm generated in isolation grooves 6; then, the very small unevennesses of several hundreds to several thousands of angstroms remaining after the mechanical polishing are eliminated by mechanochemical polishing to obtain a mirror surface of about 100 Å or less required for complete wafer bonding.

Figure 16:
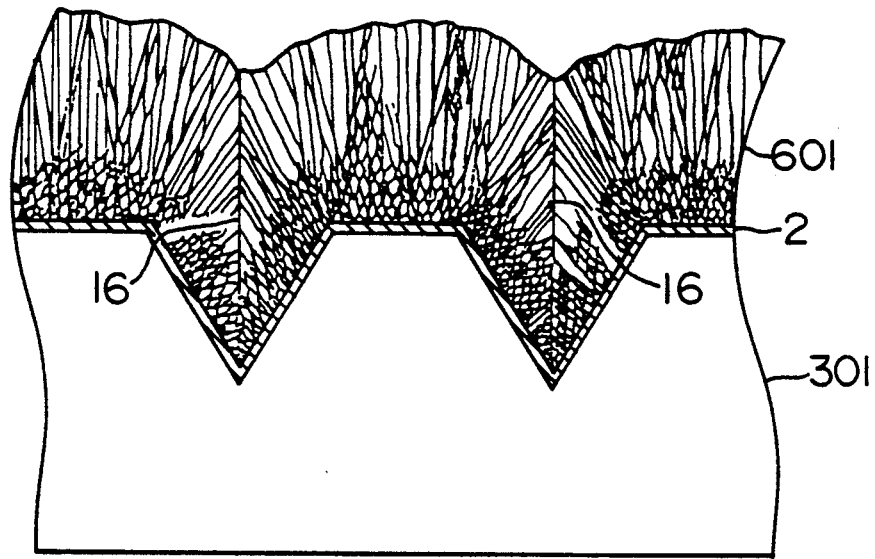
FIG. 16 is a sectional view of isolation grooves in each of which an interface has been formed between polycrystalline silicon grains.

Meanwhile, crystal growth takes place in a direction perpendicular to the crystal plane; therefore, in the polycrystalline silicon 601 in each of the isolation grooves 6, there is formed an interface 16 at which the polycrystalline silicon grains of two different growth directions collide with each other, as shown in FIG. 16.

At or in the vicinity of each interface 16, the rate of mechanical polishing is large; accordingly, the polishing progresses at a larger rate in the isolation grooves 6 than at the bottoms of the single crystal islands 3 and, when the polishing has progressed until no polycrystalline silicon 601 remains on the bottoms of the islands 3, the polycrystalline silicon 601 in the isolation grooves 6 is lower (dented) by several hundreds of angstroms than the bottoms of the islands 3, making it impossible to obtain a smooth flat surface having evennesses of 100 Å or less required for complete wafer bonding.

The reasons for that the polishing progresses at a larger rate in the isolation grooves 6 than at the bottoms of the single crystal islands 3, are presumed to be as follows. The inner surfaces of the grooves and the original surface of the semiconductor substrate are not on the same plane and form an angle, and the polycrystalline silicon has different orientations in these two regions. Meanwhile, the rate of polishing of semiconductor material depends on the crystal grain diameters or crystal face orientation of the material, and therefore, there arises a level difference between the top end of each groove and the original surface of the semiconductor substrate. In the experiment by the present inventor, a level difference of about maximum 600 Å was observed when the grooves had a depth of 50 $\mu$m.

Usually, the polishing rate in the polishing having a chemical polishing action, such as mechanochemical polishing or the like is easily affected by the grain diameters, face orientation, growth direction, etc. of crystals and it is very difficult to obtain a smoothness degree of 100 Å or less by such polishing except for the cases where the entire part of the polished surface is a single crystal or amorphous or where the entire part of the polished surface consists of crystal grains of very small diameters (accordingly, the crystal face orientation and growth direction can be neglected), i.e. a polycrystalline layer equivalent to an amorphous layer.

Such a problem can be solved by the method (4) or the method (5) described below.

(4) A dielectric film is formed on one principal surface of a semiconductor single crystal wafer, having isolation grooves; polycrystalline silicon is formed on the dielectric film; the polycrystalline silicon is polished to make its surface substantially smooth and flat; a buffering layer is formed on the surface; then, the buffering layer is polished to make its surface smooth and flat; a single crystal support is bonded to the smooth flat surface to complete a dielectric isolated substrate of bonded structure.

Thereafter, a semiconductor element is formed in each of the isolated islands of the dielectric isolated substrate obtained above, to complete a semiconductor integrated circuit device.

In the above constitution, the isolation grooves of deep dent are filled with the polycrystalline silicon of relatively shallow dent, and the buffering layer has no dent caused by the isolation grooves. Accordingly, the polishing of the buffering layer gives a very smooth flat surface for bonding, and complete wafer bonding is obtained.

This complete wafer bonding ensures sufficient bond strength, which causes neither peeling of isolated islands from support nor shifting of the islands even when a heat treatment has been applied to the islands in order to form semiconductor elements therein.

The method (4) is hereinafter described in detail with reference to FIG. 15. FIGS. 15(a) to 15(e) are sectional views for explaining a process for producing a dielectric isolated substrate according to the method (4).

Figure 15A:
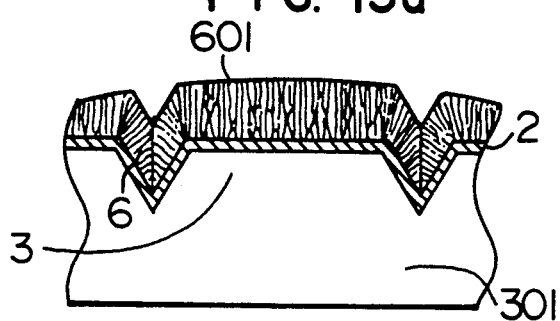
FIGS. 15(a) to 15(e) are sectional views for explaining a process for producing a dielectric isolated substrate according to the method (4) of the present invention.

At first, isolation grooves 6 and a dielectric film 2 are formed on one principal surface of a single crystal silicon wafer 301 of 4 in. in diameter and 500 $\mu$m in thickness in the same manners as in the prior art; then, polycrystalline silicon 601 is formed in a film thickness of 100 $\mu$m [see FIG. 15(a)].

Figure 15B:
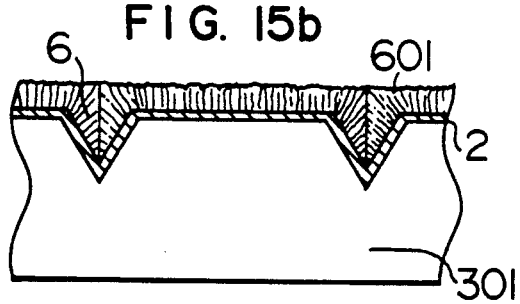

Next, in the same manner as mentioned above, the surface of the polycrystalline silicon 601 is ground mechanically to remove the unevennesses of about several tens of micrometers caused by the isolation grooves 6, after which the resulting polycrystalline silicon 601 is subjected to mechanochemical polishing to allow the polycrystalline silicon 601 to have a smooth flat surface [see FIG. 15(b)].

In this case, it is desirable that the polycrystalline silicon 601 be polished very close (10 $\mu$m or less) to the single crystal silicon wafer 3 in order to minimize the curvature of the wafer 3 which occurs owing to the shrinkage or expansion of the polycrystalline silicon 601 in the later heat treatment applied for formation of semiconductor elements in single crystal silicon regions 3.

In this method (4), the polished surface of the polycrystalline silicon 601 may have unevennesses of about several hundreds of angstroms because a polycrystalline silicon layer is later formed on said surface. Accordingly, when it is desired to simplify the production process to shorten the process time, only mechanical grinding is conducted and the subsequent mechanochemical polishing may be omitted.

Figure 15C:
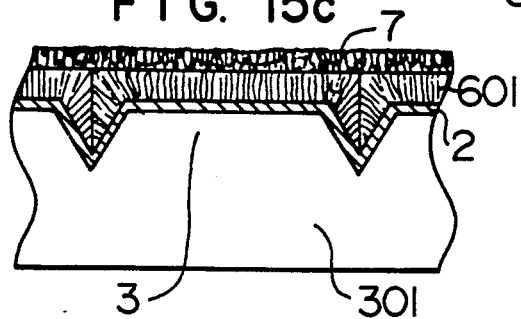
Figure 15D:
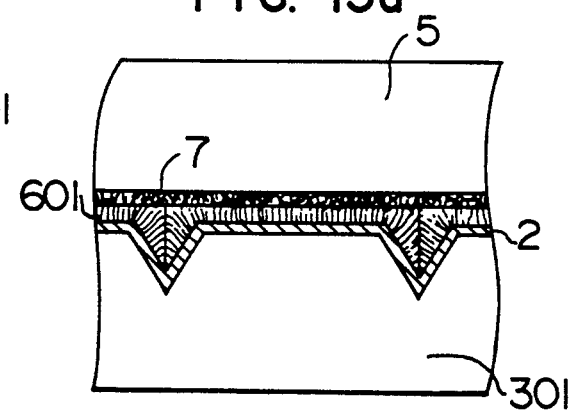

Then, on the polished surface of the polycrystalline silicon 601 is formed a polycrystalline silicon layer 7 (this layer becomes a buffering film for absorbing the very small unevennesses remaining on said surfaces of the polycrystalline silicon 601) in close contact with said surface, in a film thickness of preferably about 5 $\mu$m, according to ordinary chemical vapor deposition [see FIG. 15(c)]. In this case, since the thickness of the polycrystalline silicon layer 7 is one over several tens of the thickness of the polycrystalline silicon 601, chemical vapor deposition of hot wall type may be employed wherein the rate of film formation is small but a number of wafers can be treated simultaneously and the product cost can be reduced.

This polycrystalline silicon layer 7 grows on the polycrystalline silicon 601 having a relatively smooth flat surface unlike the case where the polycrystalline silicon 601 is formed on the dielectric film 2 having the deep dents of the isolation grooves 6; accordingly, its growth direction is single. As a result, no interface as shown in FIG. 16 appears in the polycrystalline silicon layer 7.

Thereafter, the surface of the polycrystalline silicon layer 7 is subjected to mechanochemical polishing (about 3 $\mu$m is removed) to convert it to a smooth flat surface. In this case, a smooth flat surface of 100 Å or less can be easily obtained because the polycrystalline silicon layer 7 has no interface.

Figure 15E:
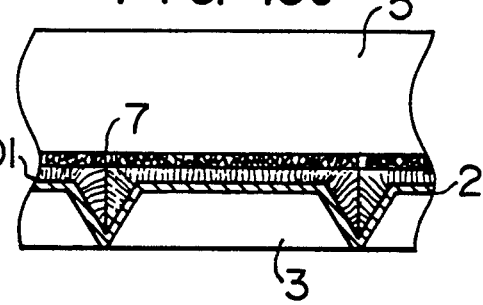

Next, a single crystal wafer 5 (which later becomes a support) of 3 in. in diameter and 500 μm in thickness is bonded to the surface of the polycrystalline silicon layer 7 in the same manner as mentioned above [see FIG. 15(d)]; the unnecessary portion of the single crystal wafer 301 is removed by polishing, to complete a dielectric isolated substrate 1 [see FIG. 15(e)].

Lastly, a semiconductor element is formed in each of the single crystal islands 3 according to an ordinary LSI process and wiring is conducted between the elements to complete a semiconductor integrated circuit device.

According to the method (4), the deep dents of the isolation grooves 6 are converted to relatively shallow dents of the polycrystalline silicon 601; therefore, there appears no interface in the polycrystalline silicon layer 7 which is a buffering layer.

Consequently, the polycrystalline silicon layer 7 can be polished so as to have a very smooth flat surface; this surface enables complete bonding to the wafer (support) 5; thereby, a dielectric isolated substrate of high reliability can be provided.

Incidentally, when the chemical vapor deposition of hot wall type is employed, the polycrystalline silicon layer 7 can be formed at a low temperature and the crystal grains of the layer 7 can be made smaller than those when ordinary chemical vapor deposition is employed. That is, by forming the polycrystalline silicon layer 7 according to the chemical vapor deposition of hot wall type, the diameters of the crystal grains of the layer 7 can be made smaller than those of the portion of the polycrystalline silicon layer 601 adjacent to the layer 7.

As a result, the polycrystalline silicon layer 7 can be mechanochemically polished to a surface of the same smoothness as obtained when an amorphous silicon layer undergoes the same treatment. Therefore, when the polycrystalline silicon layer 7 is formed by employing the chemical vapor deposition of hot wall type, its surface is made more smooth and flat than in ordinary chemical vapor deposition and more complete wafer bonding is obtained.

FIGS. 17(a) to 17(d) are sectional views for explaining a process for producing a dielectric isolated substrate according to the method (5). The same numerals are given to the same or equivalent substrate constituents as in FIGS. 15(a) to 15(e).

Figure 17A:
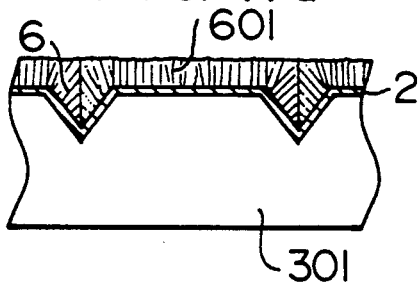
FIGS. 17(a) to 17(d) are sectional views for explaining a process for producing a dielectric isolated substrate according to the method (5) of the present invention.

The steps for producing isolation grooves 6 and a dielectric film 2 on the surface of a single crystal wafer 301, then forming polycrystalline silicon 601 (thickness: 100 μm) on the dielectric film 2 and polishing the polycrystalline silicon 601 to obtain a smooth flat surface [see FIG. 17(a)] are the same as before. Therefore, explanation on these steps is omitted.

Figure 17B:
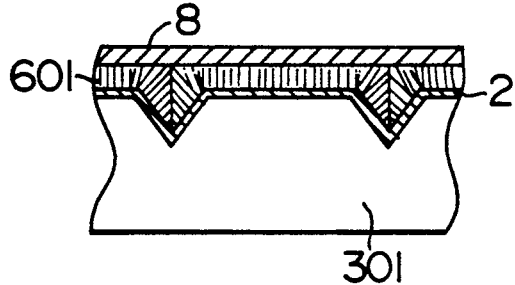
Figure 17C:
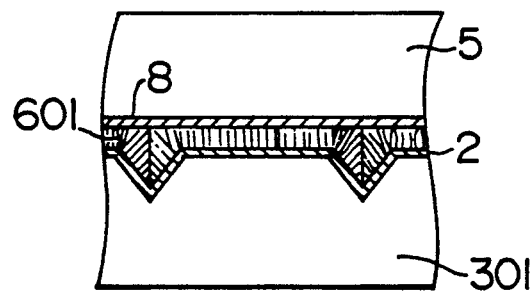

Then, on the smooth flat surface of the polycrystalline silicon 601 is formed an amorphous silicon layer 8 in a thickness of about 3 μm according to chemical vapor deposition [see FIG. 17(b)].

Thereafter, the amorphous silicon layer 8 is removed by a thickness of about 1 μm by mechanochemical polishing to make its surface smooth and flat. In this case, since the polycrystalline silicon 601 has no deep dents on the surface and the amorphous silicon layer 8 has no grain boundary and is uniform and amorphous, the amorphous silicon layer 8 has no interface as shown in FIG. 16. Accordingly, the mechanochemical polishing gives a smooth flat surface of 100 Å or less very easily.

Figure 17D:
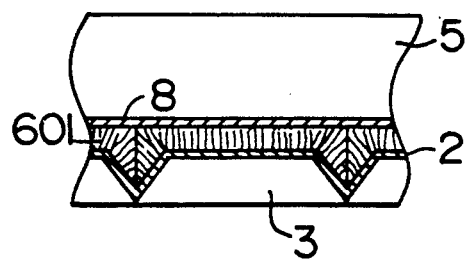
Figure 18:
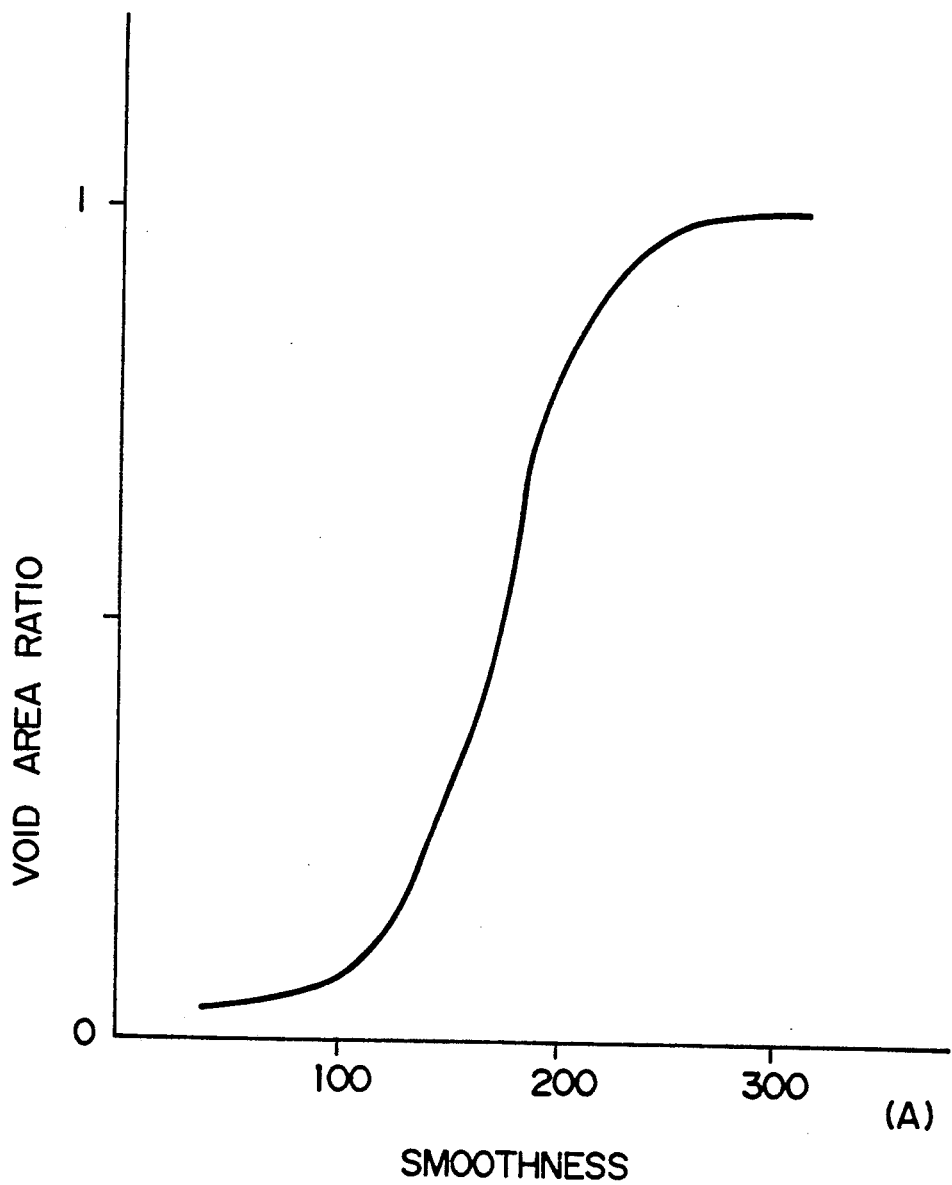
FIG. 18 is a graph showing the relation between smoothness degree and void area ratio.

After that, a support 5 is bonded to the smooth flat surface of the amorphous silicon layer 8 in the same manner as mentioned above [see FIG. 17(c)]; the unnecessary portion of the single crystal wafer 301 is removed by polishing, to complete a dielectric isolated substrate 1 [see FIG. 17(d)].

Lastly, a semiconductor element is formed in each of the single crystal islands 3 according to an ordinary LSI process and wiring is conducted between the elements to complete a semicondcutor integrated circuit device.

According to the method (5), since the buffering layer is amorphous, the smoothness obtained by mechanochemical polishing is further improved as compared with the method (4), and more complete bonding is obtained.

In the above methods, the buffering layer is a semiconductor layer made of polycrystalline silicon or single crystal silicon. However, it may be an insulating film such as $SiO_2$ film or the like. A $SiO_2$ film can be easily formed by oxidizing the surface of the polycrystalline silicon 601.

Also, the above methods were explained on respective cases where the buffering layer contains silicon. However, the present invention is not restricted to these cases, and the use of a buffering layer or film containing, as its main component, other substance such as germanium or the like can give the same effect.

As is clear from the above description, according to the present invention, the surface to be bonded to a support can be made smooth and flat by polishing, complete wafer bonding is made possible, and there can be provided a dielectric isolated substrate of high reliability.

By forming a semiconductor element in each of the single crystal islands of such a dielectric isolated substrate, there can be provided a semiconductor integrated circuit device of high reliability.

The dielectric isolated substrate of the present invention can also be produced so as to have other structure as described below, by the following method (6). (6) A polycrystalline layer whose crystal grains have substantially the same size and are not oriented in any particular direction, is formed by deposition on a semiconductor substrate having isolation grooves formed thereon. Specifically, fine particles are deposited on the substrate by chemical vapor deposition using a reactive gas of high concentration and the spaces between the deposited fine particles are filled by the surface reaction of the particles.

According to the method (6), fine particles are accumulated on the substrate in a non-oriented state as if they were accumulated by gravity and, at the same time, the spaces between the deposited fine particles are filled by the crystal growth of these particles; resultantly the growth and orientation of polycrystals in prismatic shapes can be avoided.

Figure 14A:
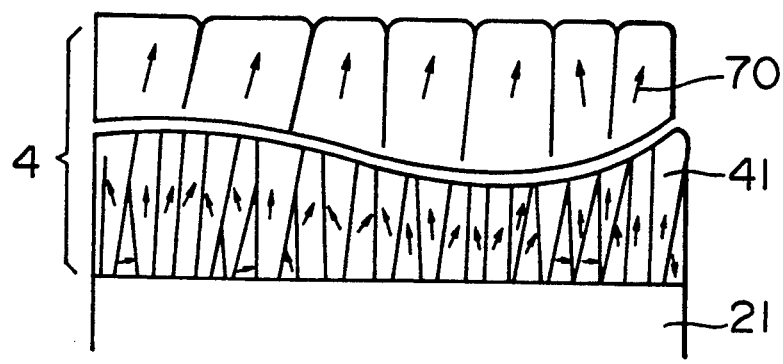
FIGS. 14(a) to 14(c) are sectional views of substrates for explaining other process of the present invention.
Figure 14B:
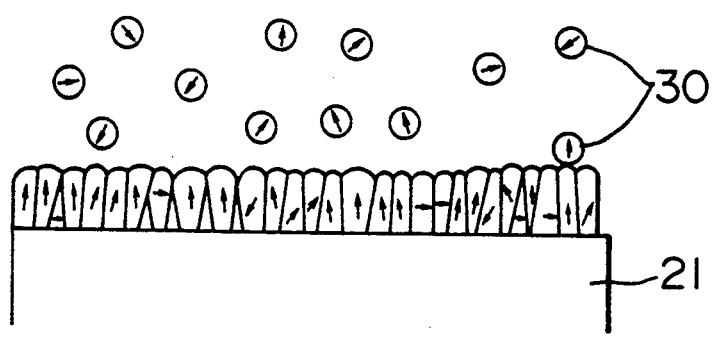
Figure 14C:
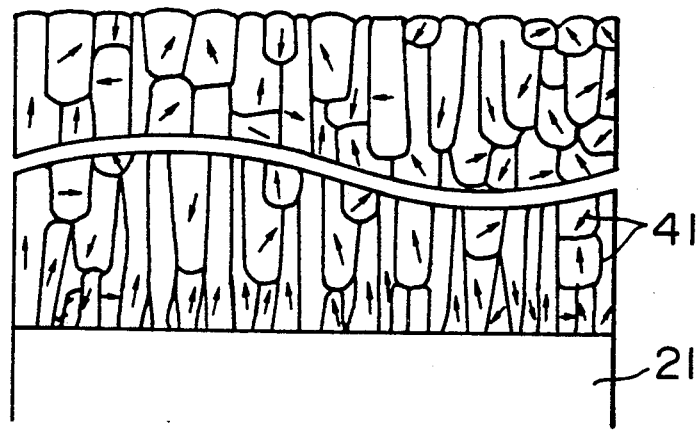

This action is explained with reference to FIGS. 14(a) to 14(c). FIGS. 14(a) to 14(c) are sectional views of polycrystalline layers obtained by the conventional method and the method (6). FIG. 14(a) shows a polycrystalline silicon layer 4 formed on a substrate 21 by conventional chemical vapor deposition. Crystal grains 41 grow in a reversely conical shape in a direction perpendicular to the substrate 21 and are oriented to a (110) direction 70. On the other hand, in the method (6), fine particles 30 are generated in a space above the substrate as shown in FIG. 14(b); they are deposited on the surface of the substrate 21 in a non-oriented state; then, crystal grains 41 grow from the deposited fine particles 30 acting as nuclei; as a result, there grains, as shown in FIG. 14(c). Since the growth of crystal grains to larger sizes is prevented by the continuous deposition of fine particles, the diameters of crystal grains remain substantially constant even if the layer thickness is made large.

Accordingly, when a layer is formed, by deposition, on the substrate having isolation grooves formed thereon, the layer is uniform and polycrystalline and the crystal grains of the layer have no difference in diameter and orientation between the island portions and the groove portions. As a result, when polished, the layer gives a polished surface of significantly improved smoothness.

In the conventional chemical vapor deposition technique, it was common that a raw material gas is reacted on the surface of a substrate to form polycrystals or single crystals. Therefore, the fine particles generated a gas phase and deposited on the substrate surface by gravity has been regarded as an impurity. This has been a reason for significant reduction of element properties particularly in the epitaxial step for forming operational regions of elements. This, however, poses no problem when, as in the method (6), the layer formed by chemical vapor deposition is used as part of a support. Rather, the method (6) has an advantage in that fine particles can be deposited at a high rate by increasing the material gas concentration significantly from conventional 1-2% to several tens of percents.

As the non-oriented material, an amorphous material is considered besides polycrystalline silicon. However, the amorphous material is small in deposition rate and causes shrinkage in the later heat treatment applied in the step for element formation to give rise to the curvature of substrate; therefore, it cannot be used as it is.

Figure 10A:
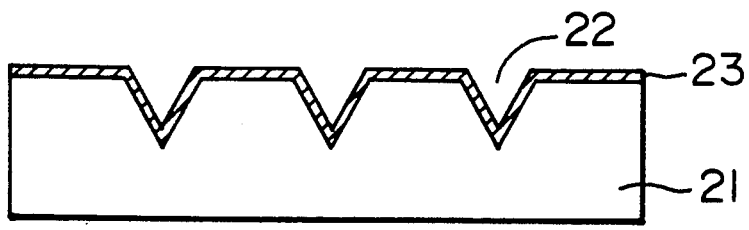
FIGS. 10(a) to 10(e) are sectional views for explaining a process for producing a dielectric isolated substrate according to the method (6) of the present invention.
Figure 10B:
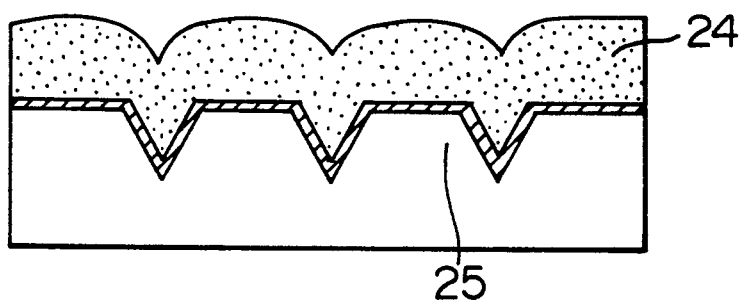
Figure 10C:
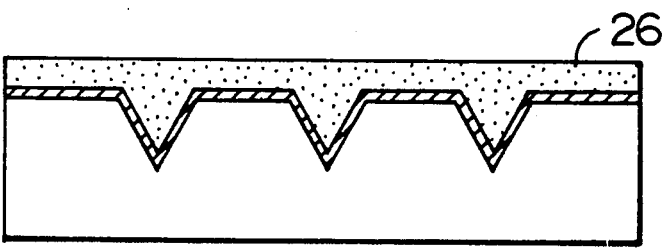
Figure 10D:
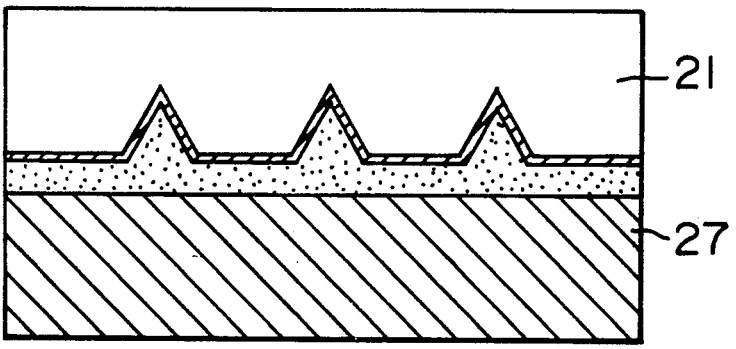
Figure 10E:
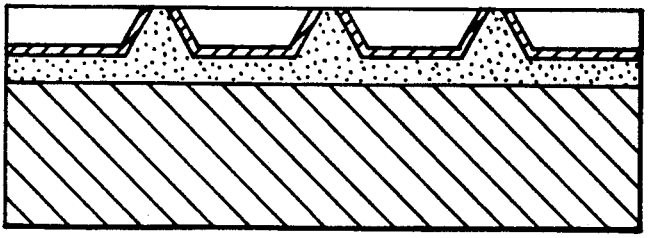

The method (6) is described hereinafter with reference to FIGS. 10(a) to 10(e) which are sectional views showing each step of the method (6). Firstly, FIG. 10(a) shows a state where isolation grooves 22 have been formed on a single crystal silicon substrate 21 having a n type (100) plane and a diameter of 6 in. and then a $SiO_2$ film 23 of 2 $\mu$m in thickness has been formed on the isolation grooves 22 by steam oxidation. FIG. 10(b) shows a state where a polycrystalline silicon layer 24 is formed on the $SiO_2$ film 23 by chemical vapor deposition. The conditions for formation of the polycrystalline silicon film 24 were as follows. Substrate temperature = 1,000°-1,250° C., preferably 1,100° C. Raw material gas = 10-30% by volume, preferably 20% by volume of $SiH_4$ gas in $H_2$ gas. Since a raw material gas of high concentration is used, fine particles are generated in a reactor in a gas phase above the substrate and deposited on the substrate surface and the spaces between the deposited fine particles are filled with silicon which grows as a result of a surface reaction. Consequently, uniform polycrystalline silicon grows on the flat portions and groove portions of the $SiO_2$ film 23. Observation by electron microscope indicated that the grain diameters of the polycrystalline silicon were about 2 $\mu$m or less, preferably about 0.1 $\mu$m. The rate of deposition of fine particles is 10 $\mu$m/min. Incidentally, when the raw material gas concentration was less than 10%, there was a tendency that the amount of fine particles deposited was small and the above-mentioned effect was low. When the raw material gas concentration was more than 30%, there was a tendency that the filling of the spaces between deposited fine particles was insufficient, which gave low mechanical strength. FIG. 10(c) shows a state where the polycrystalline silicon layer 24 has been polished and flattened. In polishing, there were used (a) a polishing solution obtained by adding a silicon powder of 0.3 $\mu$m to an aqueous KOH solution of pH 10 and (b) a polishing puff of suede type. Since the polycrystalline silicon layer 24 had the same quality on the flat portions 25 and the groove portions 22, the flatness of the polished surface 26 is equal to or less than 50 Å which is the sensitivity limit of the flatness tester. FIG. 10(d) shows a state wherein a single crystal silicon support 27 is bonded to the polished surface 26. This bonding is effected by a direct method which comprises tightly contacting the support 27 and the surface 26 and then heating them at 1,200° C. in an oxygen atmosphere. Ultrasonic flaw detection and observation by infrared transmission type microscope confirmed that owing to the improved flatness of the polished surface 26, the above bonding was complete except for the substrate peripheral portion of 2 mm in width. FIG. 10(e) shows a state where the substrate 21 has been polished until the bottoms of the isolation grooves 22 have been exposed and thereby the single crystal substrate has been converted to a plurality of islands isolated from each other. Thereafter, an element was formed in each of the single crystal islands by oxidation, diffusion or the like; however, no abnormality such as peeling at bonded surface was observed in this step, either. Observation of bonded surface by electron microscope indicated that the polycrystalline layer 24 and the support 27 were completely bonded by an oxide film of about 100 Å thick.

Figure 11:
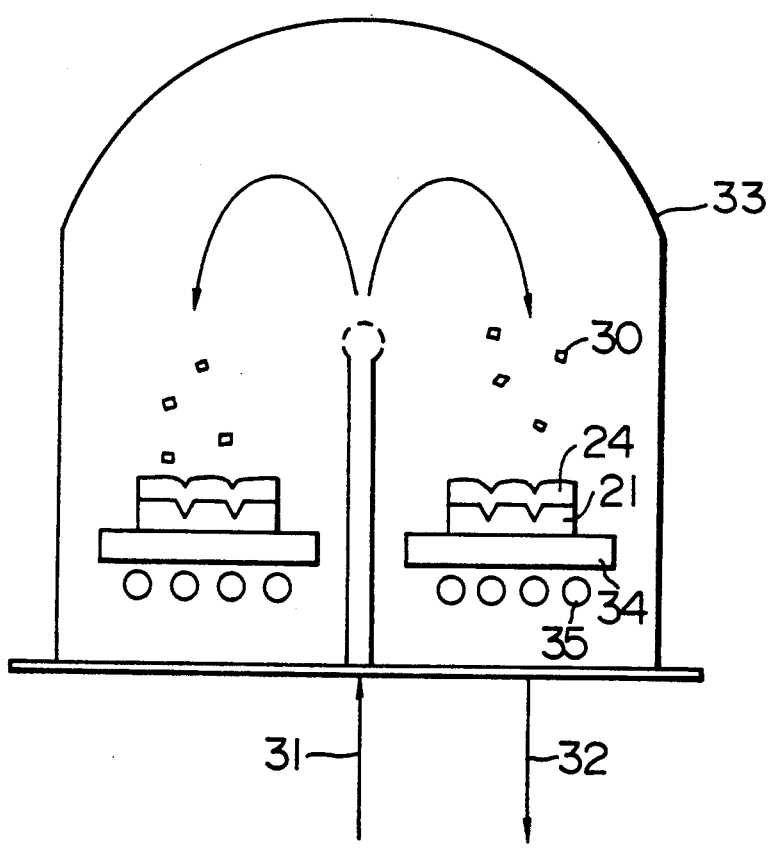
FIG. 11 is a schematic sectional view of an apparatus for accumulating polycrystalline silicon by deposition, used in a process of the present invention.

FIG. 11 is a schematic drawing of an apparatus for forming a polycrystalline silicon layer 24 by deposition, used in the method (6). A substrate 21 having grooves and an insulating film formed thereon is placed on a SiC-coated carbon susceptor 34, and is heated to 1,000°-1,250° C., preferably 1,100° C. using a high-frequency induction heater 35. A raw material gas 31 (20% of monosilane gas in $H_2$ gas) is introduced into a reactor 33 at a flow rate of 20-70 l/min, preferably 50 l/min (2-10% in terms of reactive gas concentration). When the raw material gas 31 of high concentration is introduced into the reactor 33 of high temperature, part of the reactive gas 31 initiates reaction in a gas phase above the substrate to generate fine particles 30 of silicon. The fine particles 30 are deposited on the substrate 21; the spaces between the deposited particles are filled with the silicon generated by the reaction occurring at the substrate surface; thereby, a polycrystalline silicon layer 24 is formed.

The above explanation is made on a case using $SiH_4$ as the raw material gas. However, the use of other silane type gas (e.g. $Si_2H_6$) or chlorosilane type gas (e.g. $SiH_2Cl_2$, $SiHCl_3$) does not adversely affect the scope of the present invention.

In the formation of polycrystalline silicon layer, the concentration of raw material gas is not required to be always high. The fine particles once generated by introduction of high concentration material gas keeps floating for several tens of minutes depending upon the level of gas flow rate.

Therefore, it is also possible that a high concentration gas be introduced at the initial period of silicon deposition or repeatedly in pulses and, at other times, a reactive gas be fed in the same manner as in ordinary chemical vapor deposition.

It is also possible that a very small amount of an impurity gas can be added to the raw material gas at the initial period of the reaction to control the amount of fine particles generated. For example, the addition of N$_2$O gas or CO$_2$ gas in a very small amount (several % or less) generates fine particles of SiO$_x$, and the resulting polycrystalline layer has a dense structure.

Figure 12A:
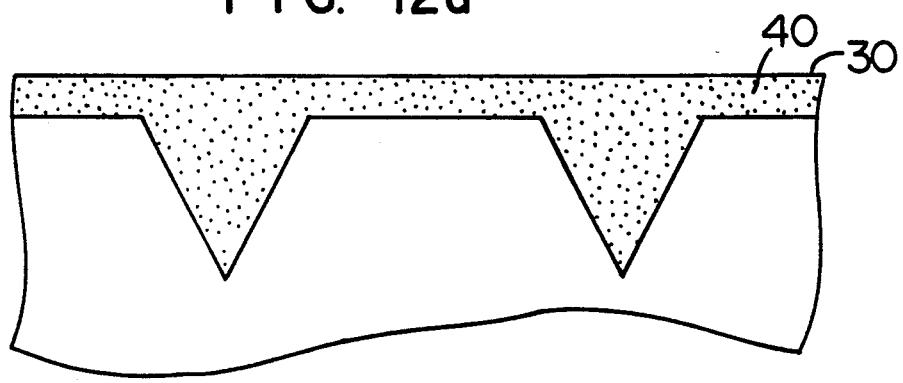
FIGS. 12(a) to 12(b) each are a sectional view of a substrate on which polycrystalline silicon has been accumulated by deposition according to a process of the present invention.
Figure 12B:
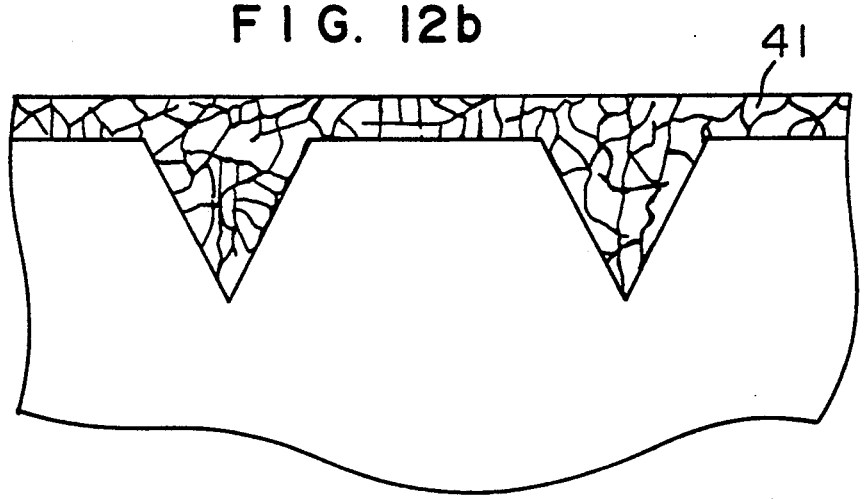

It is also possible to control the quality of polycrystalline layer formed, by controlling the temperature of substrate surface and also by controlling the amount of raw material gas fed to control the temperature of reactive gas. For example, FIG. 12(a) shows a layer formed by using a low substrate temperature of 740°–680° C. and adding 0.1% of N$_2$O to a reactive gas (SiH$_4$) at the initial period. In this layer, the fine particles 30 of SiO$_x$ are dispersed in microcrystals 40. FIG. 12(b) shows a layer formed by using a high substrate temperature of 1,200° C. and employing a high deposition rate of 14–18 μm/min. In this layer, the fine particles generated in a gas phase are deposited on the substrate, and relatively large crystals 41 grow from said fine particles acting as nuclei, in a mosaic pattern (therefore, the layer has large surface unevennesses when unpolished). Since the crystals 41 grow from the fine particles deposited in a non-oriented state and used as nuclei, the crystals 41 are also non-oriented.

The method for differentiating the reaction conditions in the space for generating fine particles, from those on the substrate surface, includes not only the above methods of controlling the reaction temperature or the gas concentration or adding an impurity gas, but also the method of applying an electromagnetic energy (e.g. light, plasma) to a gas phase to generate fine particles in the gas phase. As other embodiment of the method (6), a deposition method by optical chemical vapor deposition is hereinafter described with reference to FIG. 13. A substrate 21 having grooves formed thereon is placed on a susceptor 34 and is heated to 1,100°–1,250° C., preferably 1,100° C. using a heater 35. A monosilane gas 31 of 2–10%, preferably 4% in terms of reactive gas concentration is introduced into a reactor 33, and is irradiated with an exciting light 51 of high intensity emitted from a CO$_2$ gas laser, through an optical window 50. The reactive gas is reacted in the irradiation region to generate fine particles 30. The fine particles are deposited on the substrate 21. The spaces between the deposited fine particles are filled with the silicon generated by a surface reaction, whereby a polycrystalline layer 24 is formed. Crystal properties of the resulting layer can be controlled by excitation conditions such as position of excitation, intensity of excitation, excitation frequency and the like.

In order to precisely control the generation of fine particles as well as the growth of crystal grains by surface reaction, it is possible to install a reactor for generating fine particles separately from a reactor for depositing the fine particles on a substrate and connect the two reactors with a pipe.

The bonding of the polished surface of the formed polycrystalline layer to a support can be effected not only by a direct method but also by an anodic bonding method.

As mentioned above, the dieletric isolated substrates having strong bonding without generating voids between the single crystal support and the polycrystalline silicon layer, and if necessary via the buffering layer, can be formed by the methods (1) to (6).

What is claimed is:

1. A dielectric isolated substrate comprising
   a single crystal support,
   a connecting polycrystalline silicon layer bonded to said single crystal support, and
   a plurality of semiconductor single crystal islands insulated form each other and from said connecting polycrystalline silicon layer by a dielectric film,
   said connecting polycrystalline silicon layer having a smooth and flat surface to which said single crystal support is bonded and having a crystal structure with an average grain diameter of at least 5 μm, so as to make thermal shrinkage of the connecting polycrystalline silicon layer small, such that voids between the single crystal support and the connecting polycrystalline silicon layer are avoided.

2. A dielectric isolated substrate according to claim 1, wherein the connecting polycrystalline silicon layer is obtained at a deposition temperature of 1000° C. or higher and has a crystal growth direction almost perpendicular to sides of neighboring semiconductor single crystal islands.

3. A dielectric isolated substrate according to claim 1, wherein the connecting polycrystalline silicon layer is obtained by further heat treatment at 800° C. or higher after deposition and has an average crystal size of polycrystalline silicon of 6 μm or more near a bonded surface.

4. A dielectric isolated substrate according to claim 1, wherein the connecting polycrystalline silicon layer has at least one impurity in amounts of 20 to 200 ppm.

5. A dielectric isolated substrate according to claim 4, wherein the at least one impurity is an oxygen atom.

6. A semiconductor integrated circuit device obtained by forming a semiconductor element in each semiconductor single crystal island of the dielectric isolated substrate of claim 1.

7. A dielectric isolated substrate according to claim 1, wherein individual ones of the plurality of semiconductor single crystal islands are surrounded at sides thereof by the connecting polycrystalline silicon layer.

8. A dielectric isolated substrate according to claim 1, wherein the dielectric film has a first portion that extends along sides of the plurality of semiconductor single crystal islands and a second portion that extends along a rear surface of the plurality of semiconductor single crystal islands closest to the single crystal support, and wherein said polycrystalline silicon layer extends along said first portion and said second portion of the dielectric film.

9. A dielectric isolated substrate according to claim 1, wherein said dielectric film extends along sides of the plurality of semiconductor single crystal islands, and a rear surface thereof, so as to form a grooved portion, the grooved portion being filled with the connecting polycrystalline silicon layer, crystal grains of polycrystalline silicon of the connecting polycrystalline silicon layer extending in different directions and colliding at a center of the grooved portion.

10. A dielectric isolated substrate comprising
    a single crystal support,
    a connecting polycrystalline silicon layer bonded to said single crystal support, and
    a plurality of semiconductor single crystal islands insulated from each other and from said connecting polycrystalline silicon layer by a dielectric film,
    said connecting polycrystalline silicon layer having a smooth and flat surface to which said single crystal support is bonded and consisting of non-oriented crystal grains, whereby voids between the single crystal support and the connecting polycrystalline silicon layer are avoided.

11. A semiconductor integrated circuit device obtained by forming a semiconductor element in each semiconductor single crystal island of the dielectric isolated substrate of claim 10.

12. A dielectric isolated substrate according to claim 10, wherein individual ones of the plurality of semiconductor single crystal islands are surrounded at sides thereof by the connecting polycrystalline silicon layer.

13. A dielectric isolated substrate according to claim 10, wherein the dielectric film has a first portion that extends along sides of the plurality of semiconductor single crystal islands and a second portion that extends along a rear surface of the plurality of semiconductor single crystal islands closest to the single crystal support, and wherein said polycrystalline silicon layer extends along said first portion and said second portion of the dielectric film.

14. A dielectric isolated substrate comprising
a single crystal support,
a buffering layer bonded to said single crystal support,
a polycrystalline silicon layer, having a surface in contact with said buffering layer, and
a plurality of semiconductor single crystal islands insulated form each other and from said polycrystalline silicon layer by a dielectric film,
said buffering layer having a smooth and flat surface to which said single crystal support is bonded, said smooth and flat surface of said buffering layer being flatter than the surface of the polycrystalline silicon layer in contact with the buffering layer, and said buffering layer being made of a material selected from the group consisting of polycrystalline silicon, $SiO_2$ and amorphous silicon.

15. A semiconductor integrated circuit device obtained by forming a semiconductor element in each semiconductor single crystal island of the dielectric isolated substrate of claim 14.

16. A dielectric isolated substrate according to claim 14, wherein individual ones of the plurality of semiconductor single crystal islands are surrounded at sides thereof by the connecting polycrystalline silicon layer.

17. A dielectric isolated substrate according to claim 14, wherein the buffering layer is made of polycrystalline silicon, the polycrystalline silicon of the buffering layer having a smaller crystal grain diameter than polycrystalline silicon of the polycrystalline silicon layer.

18. A dielectric isolated substrate according to claim 14, wherein the dielectric film has a first portion that extends along sides of the plurality of semiconductor single crystal islands and a second portion that extends along a rear surface of the plurality of semiconductor single crystal islands closest to the single crystal support, and wherein said polycrystalline silicon layer extends along said first portion and said second portion of the dielectric film.

19. A dielectric isolated substrate according to claim 18, wherein said buffering layer extends along parts of the polycrystalline silicon layer extending along both the first and second portions of the dielectric film.

20. A dielectric isolated substrate according to claim 14, wherein the buffering layer is made of amorphous silicon.

21. A dielectric isolated substrate comprising
a single crystal support,
a connecting polycrystalline silicon layer bonded to said single crystal support, and
a plurality of semiconductor single crystal islands insulated from each other and from said connecting polycrystalline silicon layer by a dielectric film,
said connecting polycrystalline silicon layer having a smooth and flat surface to which said single crystal support is bonded and including at least one impurity, derived from $CO_2$ or $N_2O$, so as to make thermal shrinkage of the polycrystalline silicon layer small such that voids between the single crystal support and the connecting polycrystalline silicon layer are avoided.

22. A dielectric isolated substrate according to claim 21, wherein the connecting polycrystalline silicon layer has at least one impurity in amounts of 20 to 200 ppm.

23. A dielectric isolated substrate according to claim 22, wherein the at least one impurity is an oxygen atom.

24. A dielectric isolated substrate according to claim 21, wherein individual ones of the plurality of semiconductor single crystal islands are surrounded at sides thereof by the connecting polycrystalline silicon layer.

25. A dielectric isolated substrate according to claim 21, wherein the dielectric film has a first portion that extends along sides of the plurality of semiconductor single crystal islands and a second portion that extends along a rear surface of the plurality of semiconductor single crystal islands closest to the single crystal support, and wherein said polycrystalline silicon layer extends along said first portion and said second portion of the dielectric film.

26. A semiconductor integrated circuit device obtained by forming a semiconductor element in each semiconductor single crystal island of the dielectric isolated substrate of claim 17.

* * * * *